United States Patent [19]

Matsuo

[11] Patent Number: 5,396,094
[45] Date of Patent: Mar. 7, 1995

[54] SEMICONDUCTOR MEMORY DEVICE WITH A CAPACITOR HAVING A PROTECTION LAYER

[75] Inventor: Naoto Matsuo, Ibaraki, Japan

[73] Assignee: Matsushita Electric Industrial Co. Ltd., Osaka, Japan

[21] Appl. No.: 185,768

[22] Filed: Jan. 24, 1994

Related U.S. Application Data

[63] Continuation of Ser. No. 789,649, Nov. 8, 1991, abandoned.

[30] Foreign Application Priority Data

Nov. 9, 1990 [JP] Japan .................. 2-304735

[51] Int. Cl.⁶ .................. H01L 29/68; H01L 29/78; H01L 29/92
[52] U.S. Cl. .................. 257/310; 257/532; 257/767
[58] Field of Search ............ 257/306, 310, 532, 296, 257/307, 763, 764, 767

[56] References Cited

U.S. PATENT DOCUMENTS 5,189,503 2/1993 Suguro et al. .................. 257/310

FOREIGN PATENT DOCUMENTS 60-72261 4/1985 Japan .................. 257/310
61-90394 5/1986 Japan .................. 257/306
61-150368 7/1986 Japan .................. 257/310
62-120066 6/1987 Japan .................. 257/306

OTHER PUBLICATIONS

Hashimoto et al. "Leakage Current Reduction in Thin $Ta_2O_5$ Films for High Density VLSI Memories," IEEE Trans. on Elect. Dev. vol. 36, Jan., 1989, pp. 14–18.

Primary Examiner—Andrew J. James
Assistant Examiner—Donald L. Monin, Jr.
Attorney, Agent, or Firm—Ratner & Prestia

[57] ABSTRACT

A semiconductor memory device in which a protection layer is disposed between a silicon storage electrode and a tantalum pentoxide dielectric layer. A conductive material having a larger free energy of oxide formation than that of the tantalum pentoxide is used for forming the protection layer. Therefore, no native oxide film is formed at the interface between the storage electrode and the dielectric layer. As a result, the dielectric constant of the dielectric layer does not decrease even when the dielectric layer is a thin film.

9 Claims, 15 Drawing Sheets

SEMICONDUCTOR MEMORY DEVICE WITH A CAPACITOR HAVING A PROTECTION LAYER

This application is a continuation of application Ser. No. 07/789,649, filed Nov. 8, 1991, now abandoned.

BACKGROUND OF THE INVENTION

1. Field of the Invention

The present invention relates to a semiconductor memory device and more particularly to a storage capacitor structure of a dynamic random access memory (DRAM) and a method of producing the same.

2. Description of the Prior Art

A prior art semiconductor memory device is disclosed, for example, in Japanese Laid-Open Patent Publication No. 62-219659.

FIG. 11 shows a memory cell portion of a prior art semiconductor memory device. As shown in FIG. 11, the semiconductor memory device comprises: a silicon substrate 101; an element isolation film 102 for isolating each element region of the silicon substrate 101; a switching transistor formed at the element region of the silicon substrate 101; and a stacked storage capacitor connected to the switching transistor. The switching transistor has a gate oxide film 103 formed on the silicon substrate 101, a gate electrode 104 formed on the gate oxide film 103, and a drain 105 and a source 106 formed in the element region of the silicon substrate 101. The gate electrode 104 is covered by an interlayer isolation film 107. The storage capacitor has a storage electrode (polycrystalline silicon film) 108 connected to the source 106 of the switching transistor, a dielectric layer including an $Si_3N_4$ film 110 and a $Ta_2O_5$ film 111, and a plate electrode 109. The storage capacitor is covered by an $SiO_2$ film 112, and the storage capacitor and the switching transistor are covered by an insulating film 113.

In the prior art semiconductor memory device, a thin native oxide film (not shown) having a thickness of 1.2 to 1.5 nm is inevitably formed at the interface between the polycrystalline silicon film (first electrode) 108 and the $Ta_2O_5$ film (dielectric layer) 111. Therefore, when the $Ta_2O_5$ film 111 is relatively thick, the effect of the native oxide film on the capacitor region can be ignored, but when the $Ta_2O_5$ film 111 is relatively thin, the effect of the native oxide film on the polycrystalline silicon film 108 cannot be ignored. That is, the dielectric constant of the $Ta_2O_5$ film 111 (the dielectric constant of a bulk $Ta_2O_5$ is approximately 25, but that of a thin film is approximately 12) appears to decrease, and the cell capacitance of the semiconductor memory device decreases as a result.

SUMMARY OF THE INVENTION

The semiconductor memory device of this invention, which overcomes the above-discussed and numerous other disadvantages and deficiencies of the prior art, comprising a plurality of memory cells each having a switching transistor and a storage capacitor is provided, said storage capacitor comprises: a first electrode electrically connected to said switching transistor; a protection layer formed on said first electrode; a dielectric layer formed on said protection layer, said dielectric layer being made of a first oxide; and a second electrode formed on said dielectric layer; wherein said protection layer being made of a conductive material, the free energy of forming a second oxide by oxidizing said conductive material being greater than that of forming said first oxide.

According to the invention, a semiconductor memory device comprising a plurality of memory cells each having a switching transistor and a storage capacitor is provided, said storage capacitor comprises: a first electrode electrically connected to said switching transistor; a dielectric layer formed on said first electrode, said dielectric layer being made of a first oxide; and a second electrode formed on said dielectric layer; wherein said first electrode is made of a conductive material, the free energy of forming a second oxide by oxidizing said conductive material being greater than that of forming said first oxide.

In a preferred embodiment, said second electrode is made of a material in which the free energy of forming a third oxide by oxidizing said material is greater than that of forming said first oxide.

In a preferred embodiment, said second electrode includes at least a first layer formed on said dielectric layer and a second layer formed on said first layer, said first layer being made of a material in which the free energy of forming a third oxide by oxidizing said material is greater than that of forming said first oxide.

In a preferred embodiment, said first oxide is tantalum oxide, and said conductive material is a material selected from the group consisting of tungsten, molybdenum, tungsten silicide, and molybdenum silicide.

In a preferred embodiment, said second electrode is made of a material selected from the group consisting of tungsten, molybdenum, tungsten silicide, and molybdenum silicide.

In a preferred embodiment, said second electrode includes at least a first layer formed on said dielectric layer and a second layer formed on said first layer, said first layer being made of a material selected from the group consisting of tungsten, molybdenum, tungsten silicide, and molybdenum silicide.

According to the invention, a method of fabricating a semiconductor memory device comprising a plurality of memory cells each having a switching transistor and a storage capacitor is provided, said method comprises the steps of: forming said switching transistor in a semiconductor substrate; depositing an insulating film on said semiconductor substrate, for covering said switching transistor; forming an opening in said insulating film, said opening reaching said switching transistor; depositing a polysilicon film on said insulating film, said polysilicon film connected to said switching transistor; depositing a conductive film on said polysilicon film; patterning said polysilicon film and said conductive film into a first electrode made from said polysilicon film and a protection layer made from said conductive film; forming a dielectric layer on said protection layer, said dielectric layer being made of a first oxide in which the free energy of forming said first oxide is smaller than that of forming a second oxide by oxidizing said conductive film; and forming a second electrode on said dielectric layer.

In a preferred embodiment, said step of forming a second electrode comprises the steps of: forming a layer on said dielectric layer, said layer being made of a material in which the free energy of forming a third oxide by oxidizing said material is greater than that of forming said first oxide; and patterning said layer into said second electrode.

In a preferred embodiment, said step of forming a second electrode comprises the steps of: forming a lower layer of said second electrode on said dielectric layer, said lower layer being made of a material in which the free energy of forming a third oxide by oxidizing said material is greater than that of forming said first oxide; forming an upper layer of said second electrode on said lower layer; and patterning said upper layer and said lower layer into said second electrode.

According to the invention, a method of fabricating a semiconductor memory device comprising a plurality of memory cells each having a switching transistor and a storage capacitor is provided, said method comprises the steps of: forming said switching transistor in a semiconductor substrate; depositing an insulating film on said semiconductor substrate, for covering said switching transistor; depositing a polysilicon film on said insulating film, said polysilicon film connected to said switching transistor; depositing a first conductive film on said polysilicon film; patterning said polysilicon film and said first conductive film into a first electrode made from said polysilicon film and a protection layer made from said first conductive film; depositing a second conductive film on said semiconductor substrate for covering said first electrode and said protection layer; etching said second conductive film by using an anisotropic etching method, for covering sides of said first electrode with said second conductive film; forming a dielectric layer on said protection layer and said sides of said first electrode, said dielectric layer being made of a first oxide in which the free energy of forming said first oxide is smaller than that of forming a second oxide by oxidizing said conductive film; and forming a second electrode on said dielectric layer.

In a preferred embodiment, said step of forming a second electrode comprises the steps of: forming a layer on said dielectric layer, said layer being made of a material in which the free energy of forming a third oxide by oxidizing said material is greater than that of forming said first oxide; and patterning said layer into said second electrode.

In a preferred embodiment, said step of forming a second electrode comprises the steps of: forming a lower layer of said second electrode on said dielectric layer, said lower layer being made of a material in which the free energy of forming a third oxide by oxidizing said material is greater than that of forming said first oxide; forming an upper layer of said second electrode on said lower layer; and patterning said upper layer and said lower layer into said second electrode.

According to the invention, a method of fabricating a semiconductor memory device comprising a plurality of memory cells each having a switching transistor and a storage capacitor is provided, said method comprises the steps of: forming said switching transistor in a semiconductor substrate; depositing an insulating film on said semiconductor substrate, for covering said switching transistor; depositing a conductive film on said insulating film, said conductive film connected to said switching transistor; patterning said conductive film into a first electrode; depositing a protection film selectively on said first electrode; depositing a dielectric layer on said protection film, said dielectric layer made of a first oxide in which the free energy of forming said first oxide is smaller than that of forming a second oxide by oxidizing said conductive film; and forming a second electrode on said dielectric layer.

In a preferred embodiment, said step of forming a second electrode comprises the steps of: forming a layer on said dielectric layer, said layer being made of a material in which the free energy of forming a third oxide by oxidizing said material is greater than that of forming said first oxide; and patterning said layer into said second electrode.

In a preferred embodiment, said step of forming a second electrode comprises the steps of: forming a lower layer of said second electrode on said dielectric layer, said lower layer being made of a material in which the free energy of forming a third oxide by oxidizing said material is greater than that of forming said first oxide; forming an upper layer of said second electrode on said lower layer; and patterning said upper layer and said lower layer into said second electrode.

According to the invention, a method of fabricating a semiconductor memory device comprising a plurality of memory cells each having a switching transistor and a storage capacitor is provided, said method comprises the steps of: forming a first electrode which is made of a conductive material, said conductive material being a material selected from the group consisting of tungsten, molybdenum, tungsten silicide, and molybdenum silicide; forming a dielectric layer on said first electrode, said dielectric layer being made of a first oxide in which the free energy of forming said first oxide is smaller than that of forming a second oxide by oxidizing said conductive film; and forming a second electrode on said dielectric layer.

In a preferred embodiment, said step of forming a second electrode comprises the steps of: forming a layer on said dielectric layer, said layer being made of a material in which the free energy of forming a third oxide by oxidizing said material is greater than that of forming said first oxide; and patterning said layer into said second electrode.

In a preferred embodiment, said step of forming a second electrode comprises the steps of: forming a lower layer of said second electrode on said dielectric layer, said lower layer being made of a material in which the free energy of forming a third oxide by oxidizing said material is greater than that of forming said first oxide; forming an upper layer of said second electrode on said lower layer; and patterning said upper layer and said lower layer into said second electrode.

Thus, the invention described herein makes possible the objective of providing a semiconductor memory device in which formation of the native oxide film at the interface between the electrode and the dielectric layer is prevented so that the dielectric constant does not decrease.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
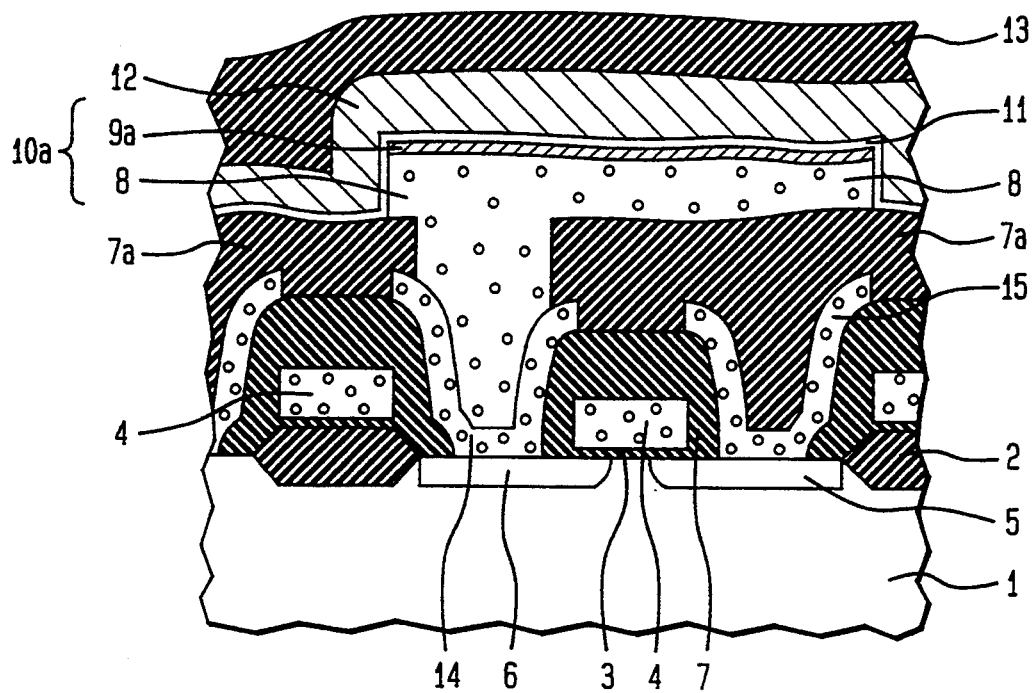
FIG. 1 is a cross-sectional view of a first embodiment of the invention.

FIG. 1 shows a memory cell portion of a semiconductor memory device of the invention. As shown in FIG. 1, the semiconductor memory device comprises: a silicon substrate 1; an element isolation film 2 for isolating each element region of the silicon substrate 1; a switching transistor formed at the element region of the silicon substrate 1; and a stacked storage capacitor connected to the switching transistor.

The switching transistor comprises: a gate oxide film 3 formed on the silicon substrate; a gate electrode 4 (also serves as word line) formed on the gate oxide film 3; and a drain 5 and a source 6 formed in the element region of the silicon substrate 1. The gate electrode 4 is covered by a first interlayer isolation film 7.

Openings are formed in the first interlayer isolation film 7 to expose the surface of the drain 5 and the source 6. A lead pad 14 for a storage electrode 10a and a lead pad 15 for the bit line (not shown) are formed in the openings. The lead pads 14 and 15 are made of polycrystalline silicon. A second interlayer isolation film 7a are formed on the first interlayer isolation film 7.

The storage capacitor comprises: the storage electrode 10a connected to the source 6 of the switching transistor; a dielectric layer 11 formed on the storage electrode 10a and the interlayer isolation film 7a; and a plate electrode 12 formed on the dielectric layer 11. The storage capacitor is covered by an insulating film 13. The storage electrode 10a includes a polycrystalline silicon layer (first electrode) 8 and a metal layer (protection layer) 9a formed on a top surface of the polycrystalline silicon layer 8. The metal layer 9a is made of tungsten (W). The dielectric layer 11 is made of $Ta_2O_5$. The plate electrode 12 is made of tungsten silicide ($WSi_2$). The respective thicknesses of the polycrystalline silicon layer 8, metal layer 9a and $Ta_2O_5$ film 11 are 200 nm, 20 nm and 11 nm.

The metal (tungsten) constituting the metal layer 9a, which is part of the storage electrode 10a, has a larger free energy for oxide formation than the free energy for oxide formation of the tantalum (Ta) constituting the dielectric layer 11. Therefore, no native oxide film or metal oxide film exists in the interface between the storage electrode 10a and the dielectric layer 11 made of tantalum pentoxide.

The respective ΔGf of the free energies of oxide formation of tungsten (W), molybdenum (Mo), tantalum (Ta) and silicon (Si) are −124, −113, −186 and −208 kcal/mol.

When the structure of the embodiment was applied to a cell (size: 1.8 μm × 1.8 μm) of a 64-Mbit DRAM, a cell capacitance Cs of 43 fF was obtained. In this first embodiment, tungsten (W) was used for the metal layer 9a that constitutes part of the storage electrode 10a, but molybdenum (Mo) can also be used for the metal layer 9a. Metal silicide layers made of tungsten silicide ($WSi_2$) or molybdenum silicide ($MoSi_2$) can also be used. We also used tungsten silicide ($WSi_2$) for the plate electrode 12, but molybdenum silicide ($MoSi_2$) can also be used. Further, a metal layer made of tungsten (W) or molybdenum (Mo) can also be used.

Figure 2:
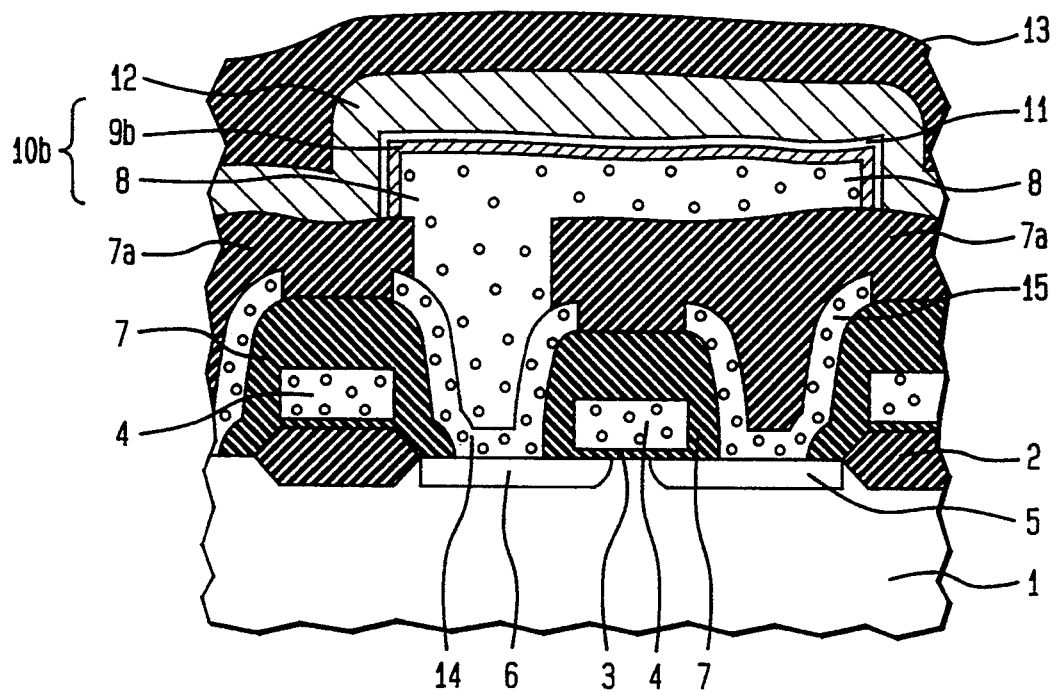
FIG. 2 is a cross-sectional view of a second embodiment of the invention.

FIG. 2 shows a second embodiment of the invention. In FIG. 2, the same numbers as in FIG. 1 indicate the same parts as in the first embodiment. As shown in FIG. 2, a storage electrode 10b comprises a polycrystalline silicon layer 8 and a metal layer 9b which covers the entire surface of the polycrystalline silicon layer 8. Further, the plate electrode 12 is made of tungsten silicide ($WSi_2$), and the dielectric layer 11 between the storage electrode 10b and the plate electrode 12 is made of tantalum pentoxide ($Ta_2O_5$).

The metal (tungsten) constituting the metal layer 9b, which is part of the storage electrode 10b, has a larger free energy for oxide formation than the free energy for oxide formation of the tantalum (Ta) constituting the dielectric layer 11. Therefore, a native oxide film or metal oxide film is not formed at the interface between the storage electrode 10b and the dielectric layer 11 made from tantalum pentoxide.

When the structure of this embodiment was applied to a cell (size: 1.8 μm × 1.8 μm) of a 64-Mbit DRAM, a cell capacitance Cs of 64 fF was obtained. In this second embodiment, tungsten (W) was used for the metal layer 9b that constitutes part of the storage electrode 10b, but molybdenum (Mo) can also be used. Metal silicide layers made of tungsten silicide ($WSi_2$) or molybdenum silicide ($MoSi_2$) can also be used.

Figure 3:
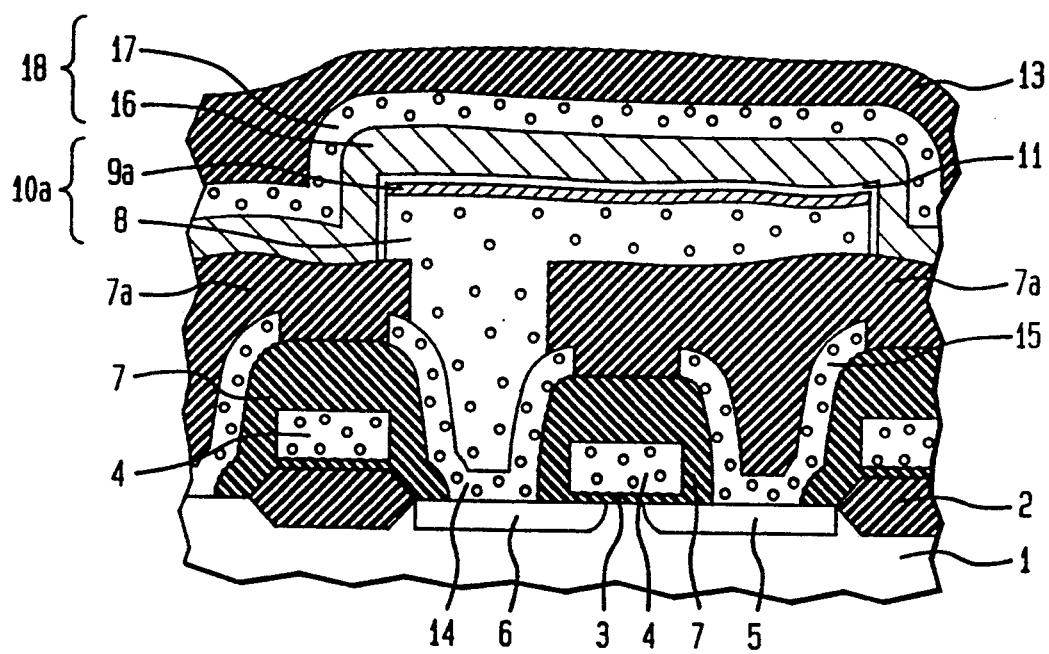
FIG. 3 is a cross-sectional view of a third embodiment of the invention.

FIG. 3 shows a third embodiment of the invention. In FIG. 3, the same numbers as in FIG. 1 indicate the same parts as in the first embodiment. As shown in FIG. 3, while the storage electrode 10a comprises the polycrystalline silicon layer 8 and the metal layer 9a formed on top of the polycrystalline silicon layer 8 as in the first embodiment, a plate electrode 18 comprises a lower tungsten silicide ($WSi_2$) layer 16 and an upper polycrystalline silicon layer 17. Further, the dielectric layer 11 disposed between the storage electrode 10a and the plate electrode 18 is made of tantalum pentoxide ($Ta_2O_5$).

The metal (tungsten) constituting the metal layer 9a, which is part of the storage electrode 10a, has a larger free energy for oxide formation than the free energy for oxide formation of the tantalum (Ta) constituting the dielectric layer 11. Therefore, no native oxide film or metal oxide film exists at the interface between the storage electrode 10a and the dielectric layer 11 made of tantalum pentoxide.

When the structure of the embodiment was applied to a cell (size: 1.8 μm × 1.8 μm) corresponding to a 64-Mbit DRAM, a cell capacitance Cs of 43 fF was obtained as in the first embodiment. In the third embodiment, tungsten (W) was used for the metal layer 9a that constitutes part of the storage electrode 10a, but molybdenum (Mo) can also be used. Metal silicide layers made from tungsten silicide ($WSi_2$) or molybdenum silicide ($MoSi_2$) can also be used. We also used a tungsten silicide ($WSi_2$) layer 16 as the bottom layer of the plate electrode 18, but molybdenum silicide ($MoSi_2$) can also be used. Further, a metal film made of tungsten (W) or molybdenum (Mo) can also be used.

Figure 4:
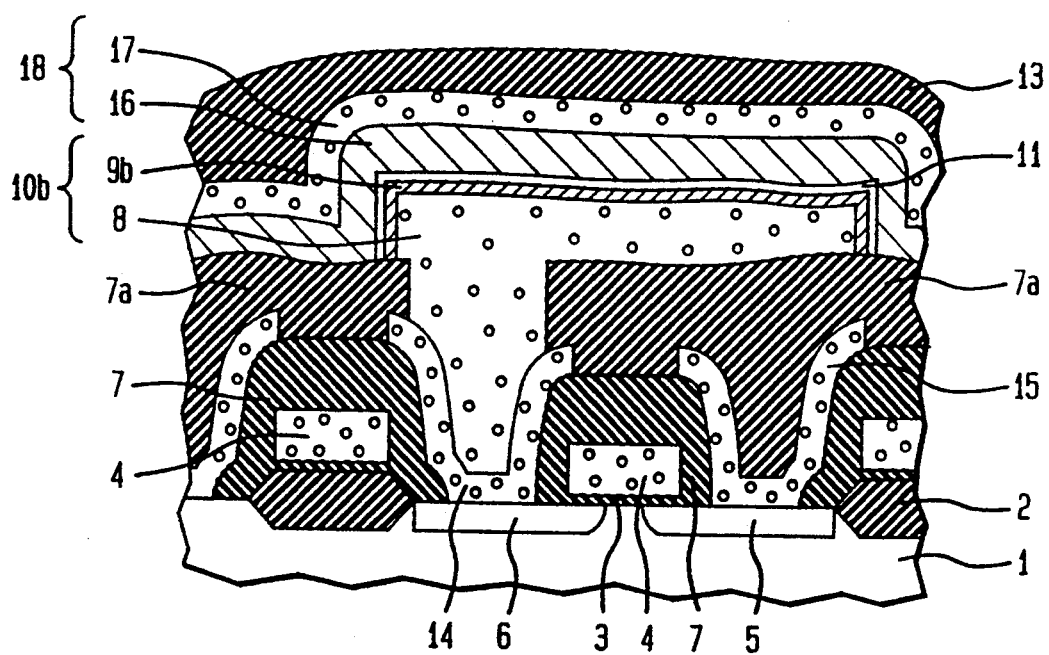
FIG. 4 is a cross-sectional view of a fourth embodiment of the invention.

FIG. 4 shows a fourth embodiment of the invention. In FIG. 4, the same numbers as in FIG. 1 indicate the same parts as in the first embodiment. As shown in FIG. 4, a storage electrode 10b comprises a polycrystalline silicon layer 8 and a metal layer 9b formed on top of the polycrystalline silicon layer 8 as in the second embodiment, and a plate electrode 18 comprises a lower tungsten silicide ($WSi_2$) layer 16 and an upper polycrystalline silicon layer 17. Further, a dielectric layer 11 disposed between the storage electrode 10b and a plate electrode 18 is made of tantalum pentoxide ($Ta_2O_5$).

The metal (tungsten) constituting the metal layer 9b, which is part of the storage electrode 10b, has a larger free energy for oxide formation than the free energy for oxide formation of the tantalum (Ta) constituting the dielectric layer 11. Therefore, no native oxide film or metal oxide film exists in the boundary between the storage electrode 10b and the dielectric layer 11 made of tantalum pentoxide.

When the structure of the embodiment was applied to a cell (size: 1.8 μm×1.8 μm) corresponding to a 64-Mbit DRAM, a cell capacitance Cs of 64 fF was obtained as in the second embodiment. In this fourth embodiment, tungsten (W) was used for the metal layer 9b that constitutes part of the storage electrode 10b, but molybdenum (Mo) can also be used. Metal silicide layers made from tungsten silicide ($WSi_2$) or molybdenum silicide ($MoSi_2$) can also be used.

We also used a tungsten silicide ($WSi_2$) layer 16 as the bottom layer of the plate electrode 18, but molybdenum silicide ($MoSi_2$) can also be used. Further, a metal layer made of tungsten (W) or molybdenum (Mo) can also be used.

Figure 5:
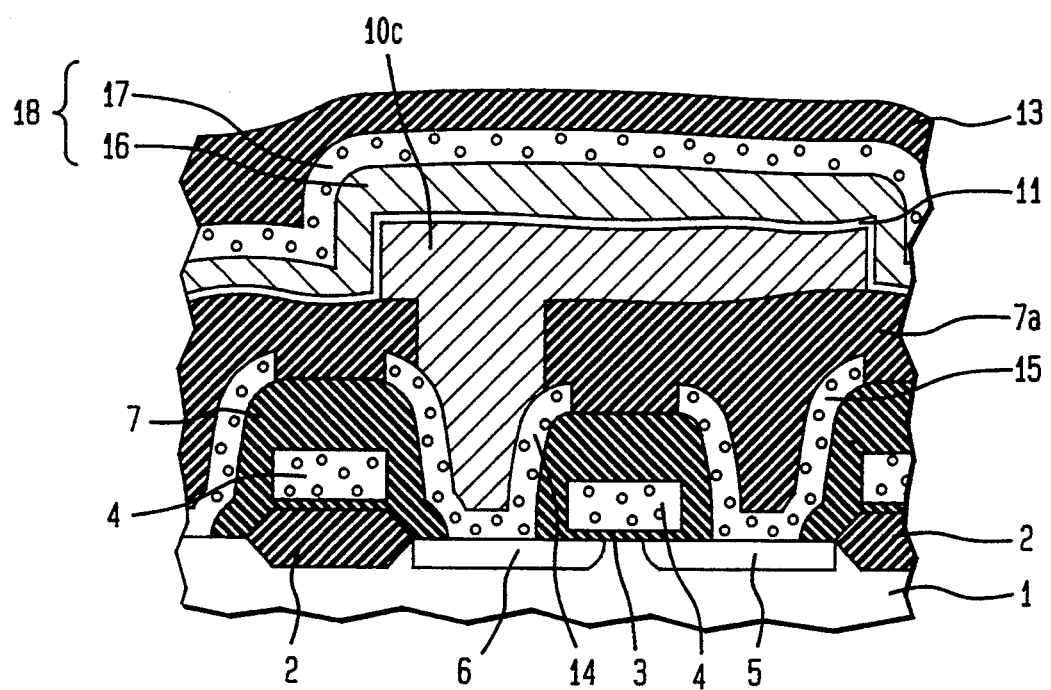
FIG. 5 is a cross-sectional view of a fifth embodiment of the invention.

FIG. 5 shows a fifth embodiment of the invention. In FIG. 5, the same numbers as in FIG. 1 indicate the same parts as in the first embodiment. As shown in FIG. 5, a storage electrode 10c is made of tungsten (W). A plate electrode 18 comprises a lower tungsten silicide ($WSi_2$) layer 16 and an upper polycrystalline silicon layer 17. Further, the dielectric layer 11 disposed between the storage electrode 10c and the plate electrode 18 is made of tantalum pentoxide ($Ta_2O_5$). The storage electrode 10c is 200 nm thick.

The metal (tungsten) constituting the metal layer 10c has a larger free energy for oxide formation than the free energy for oxide formation of the tantalum (Ta) constituting the dielectric layer 11.

When the structure of the embodiment was applied to a cell (size: 1.8 μm×1.8 μm) corresponding to a 64-Mbit DRAM, a cell capacitance Cs of 64 fF was obtained as in the second embodiment. In this fifth embodiment, tungsten (W) was used for the storage electrode 10c, but molybdenum (Mo) can also be used. Metal silicide layers made from tungsten silicide ($WSi_2$) or molybdenum silicide ($MoSi_2$) can also be used. We also used a tungsten silicide ($WSi_2$) layer 16 as the bottom layer of the plate electrode 18, but molybdenum silicide ($MoSi_2$) can also be used. Further, a metal film of tungsten (W) or molybdenum (Mo) can also be used.

In the semiconductor memory devices of the above first to fifth embodiments, the metal constituting the metal layers 9a and 9b, which are part of the storage electrodes 10a and 10b, and the metal constituting the storage electrode 10c have a larger free energy for oxide formation than the free energy for oxide formation of the tantalum (Ta) constituting the dielectric layer 11. Therefore, no metal oxide film exists at the interface between the dielectric layer 11 made of tantalum pentoxide and the metal layers 9a and 9b, which are part of the storage electrodes 10a and 10b, and no native oxide film exists between the polycrystalline silicon layer 8 and the metal layer 9a. As a result, the dielectric constant will not fall even when the dielectric layer 11 is formed as a thin film.

Figure 6A:
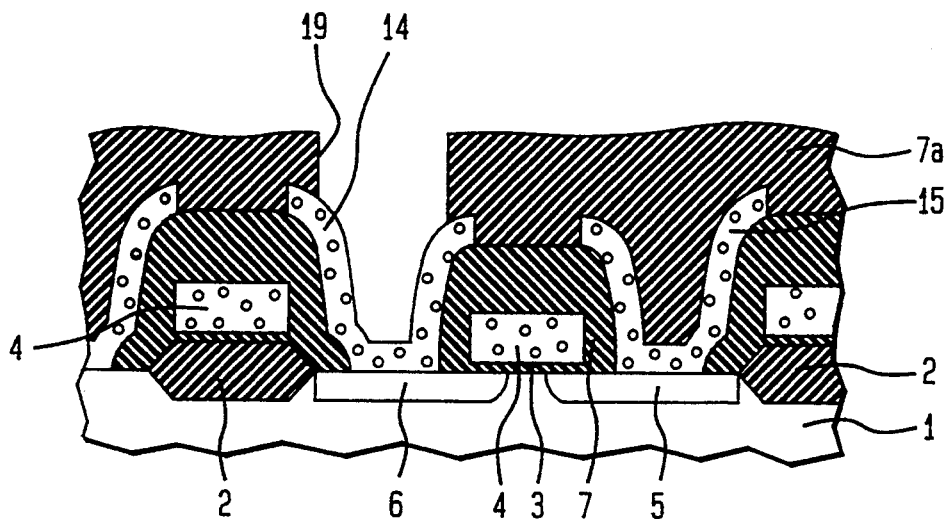
FIGS. 6A through 6E are cross-sectional views showing a sequence of processes in the production method of the first embodiment of the invention.

FIGS. 6A through 6E show a sequence of processes in the production method of the first embodiment of the invention. As shown in FIG. 6A, after the element isolation film 2 was formed on the semiconductor substrate 1, the transistor comprising the gate oxide film 3, gate electrode (also serves as word line) 4, drain 5 and source 6 was formed.

After the interlayer isolation film 7 was formed, openings were formed in the interlayer isolation film 7 to expose the drain 5 and the source 6. Then, the lead pad 15 for a bit line was formed on the drain 5 and the polycrystalline silicon lead pad 14 for the storage electrode (not shown) was formed on the source 6.

After the interlayer film (BPSG film) 7a was formed over the entire surface by a chemical vapor deposition method, it was heat treated at 900° C. for 30 minutes to smooth the surface. A contact hole 19 was also formed in the interlayer film 7a on the lead pad 14 for the storage electrode.

Figure 6B:
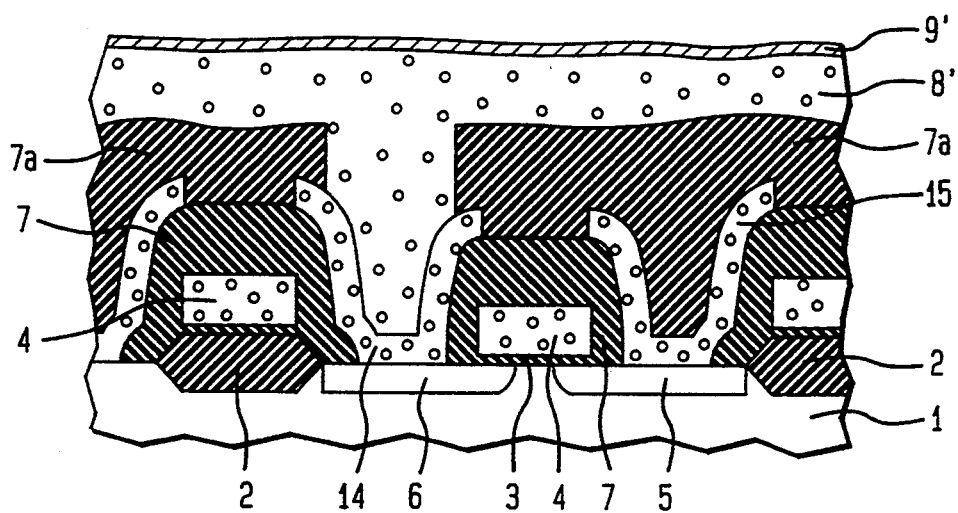

Next, as shown in FIG. 6B, the polycrystalline silicon film 8' was deposited over the entire surface including the contact hole 19, and then the tungsten film 9' was deposited on the polycrystalline silicon film 8'.

Figure 6C:
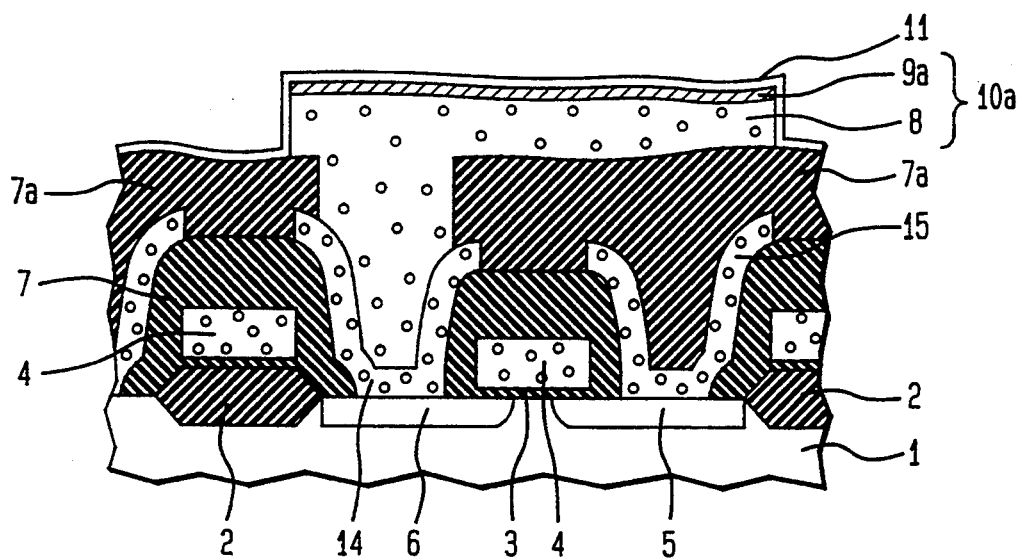

Following this, the storage electrode 10a comprising the patterned polycrystalline silicon layer 8 and tungsten layer 9a was formed by lithography and dry etching steps as shown in FIG. 6C. Also, tantalum pentoxide ($Ta_2O_5$) was deposited over the entire surface as the dielectric layer 11. Deposition of this tantalum pentoxide was performed by low-pressure chemical vapor deposition (LPCVD) at 450° C. using $Ta(OC_2H_5)_5$ as a source gas, and after deposition, an ozone annealing and a dry annealing at 900° C. in dry $O_2$ are successively performed. The source gas for the tantalum pentoxide, which becomes the dielectric layer 11, was not limited to $Ta(OC_2H_5)_5$; e.g., $TaC_{15}$ can also be used.

Figure 6D:
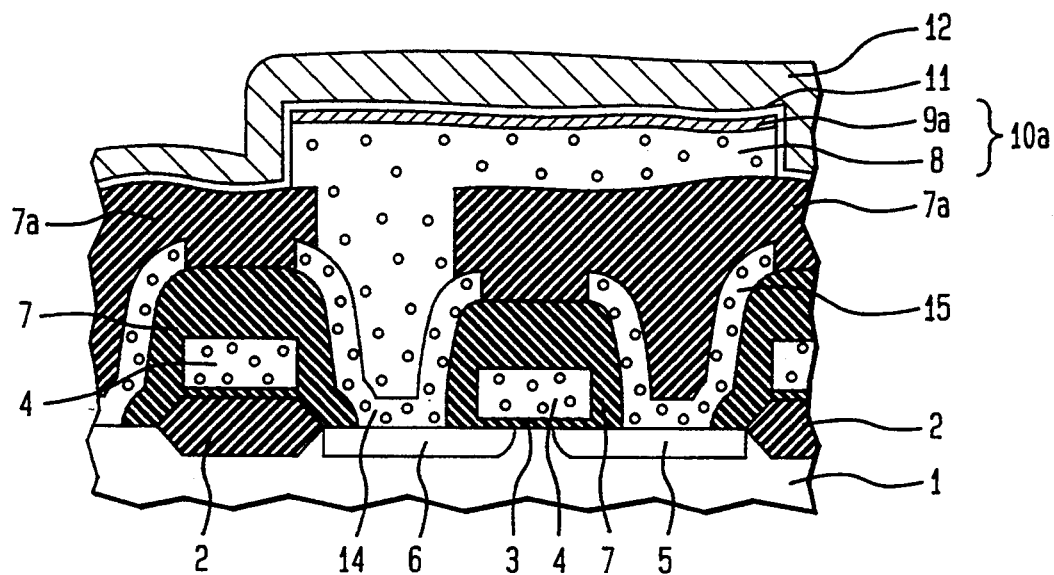
Figure 6E:
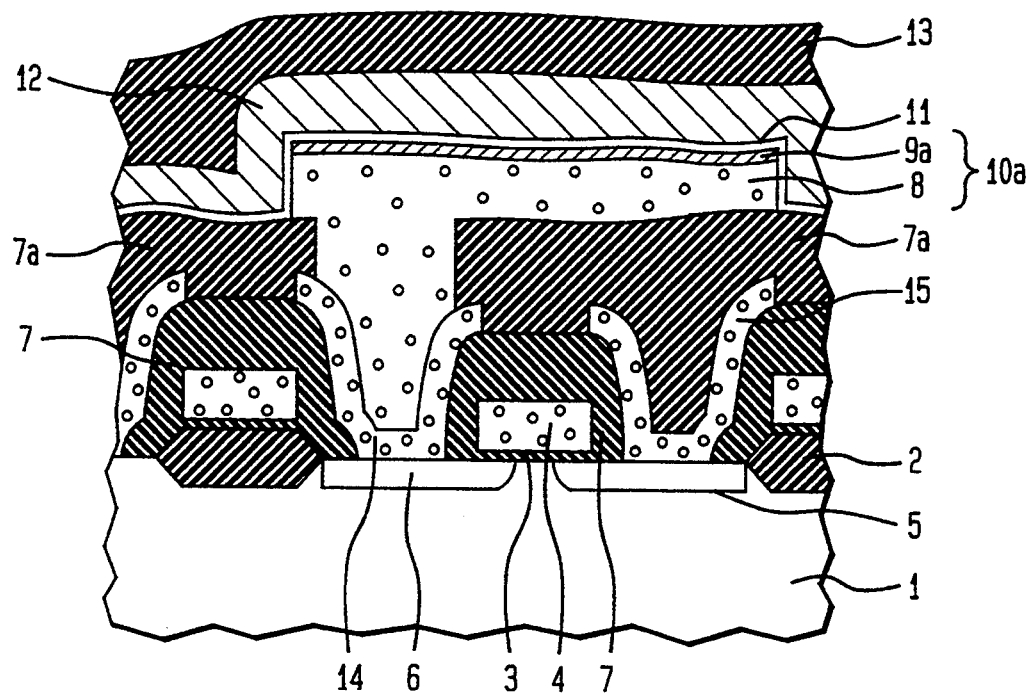

As shown in FIG. 6D, the plate electrode 12 was formed by chemical vapor deposition of tungsten silicide ($WSi_2$) over the entire surface. Next, as shown in FIG. 6E, the interlayer isolation film 13, metal wiring (not shown) and passivation film (not shown) were formed on the plate electrode 12. This FIG. 6E corresponds to the same as FIG. 1.

Figure 7A:
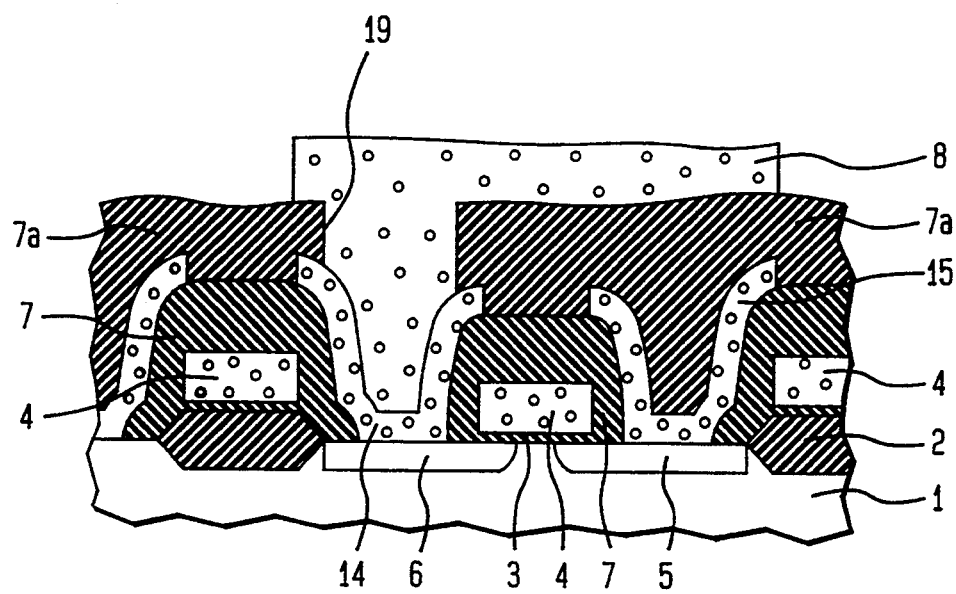
FIGS. 7A through 7D are cross-sectional views showing a sequence of processes in the production method of the second embodiment of the invention.

FIGS. 7A through 7D show a sequence of processes in the production method of the second embodiment of the invention. As shown in FIG. 7A, like in the first embodiment, the element isolation film 2, the transistor comprising the gate oxide film 3, gate electrode 4, and drain 5 and source 6, the interlayer isolation film 7, the lead pad 15 for the bit line (not shown), the polycrystalline silicon lead pad 14 for the storage electrode, the interlayer film 7a and the contact hole 19 were formed on the semiconductor substrate 1. Further, polycrystalline silicon was deposited on the polycrystalline lead pad 14 and the interlayer film 7a, and the patterned polycrystalline silicon layer 8 was formed by lithography and dry etching steps.

Figure 7B:
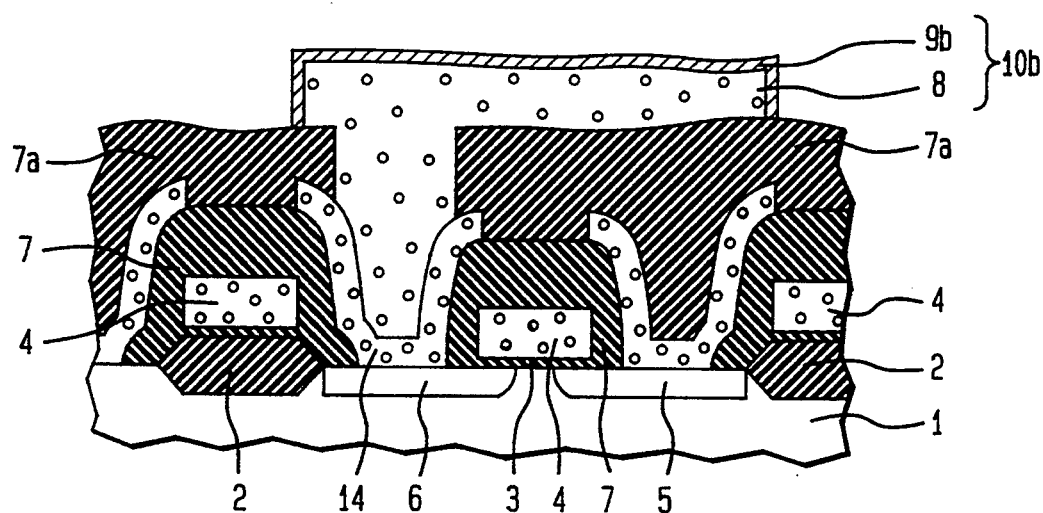

Next, as shown in FIG. 7B, the metal layer 9b made of tungsten (W) was formed only on the surface of the polycrystalline silicon layer 8 by a selective CVD technique.

Figure 7C:
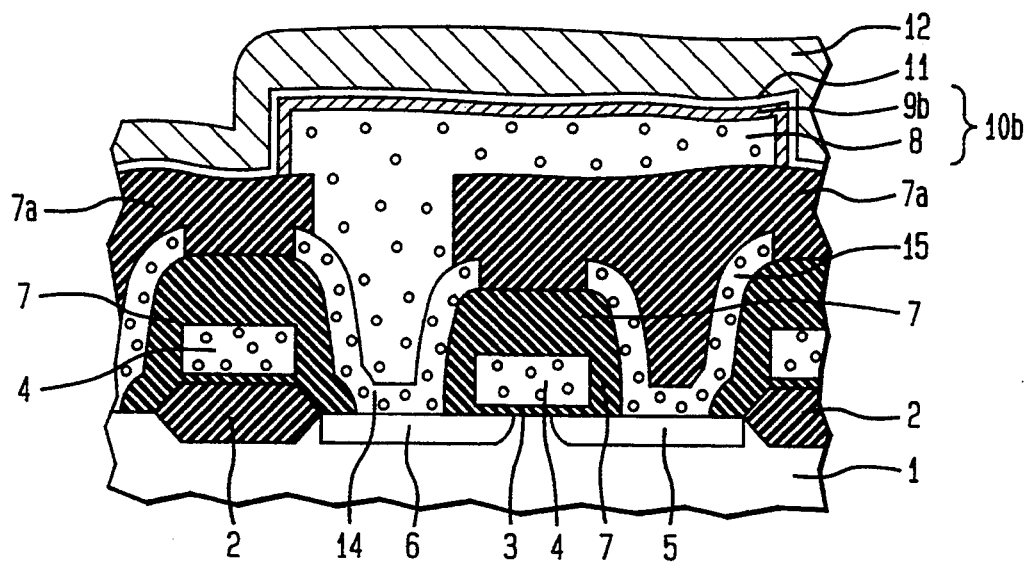

As shown in FIG. 7C, the dielectric layer 11 made of tantalum pentoxide ($Ta_2O_5$) was formed by a CVD technique, and then the plate electrode 12 was formed on the dielectric layer 11 by deposition of tungsten silicide ($WSi_2$).

Figure 7D:
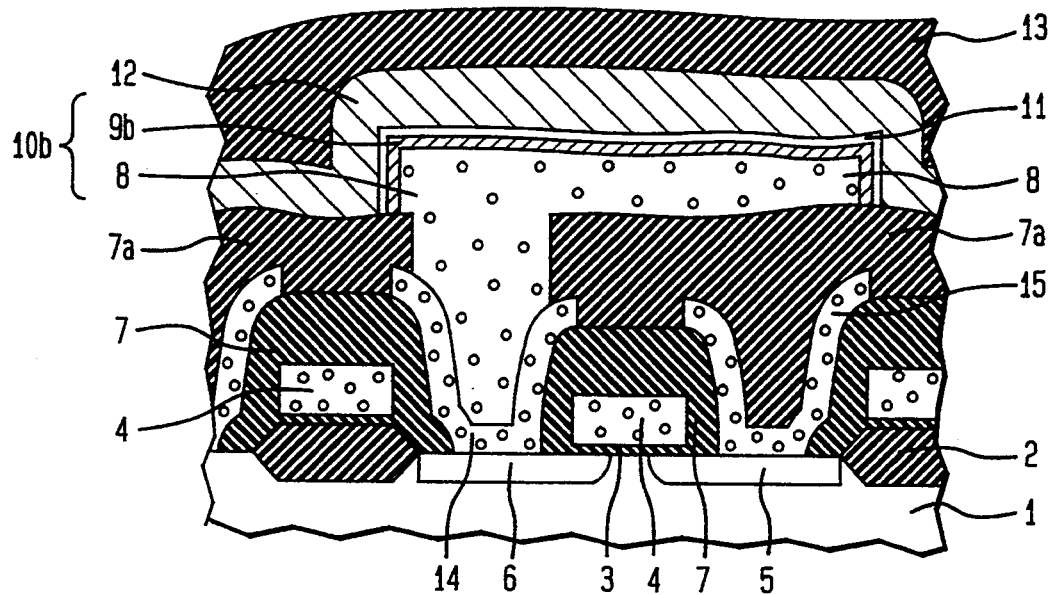

As shown in FIG. 7D, the interlayer isolation film 13, metal wiring (not shown) and passivation film (not shown) were formed on the plate electrode 12.

FIGS. 8A through 8D show a sequence of processes in the production method of the semiconductor device of the third embodiment of the invention.

Figure 8A:
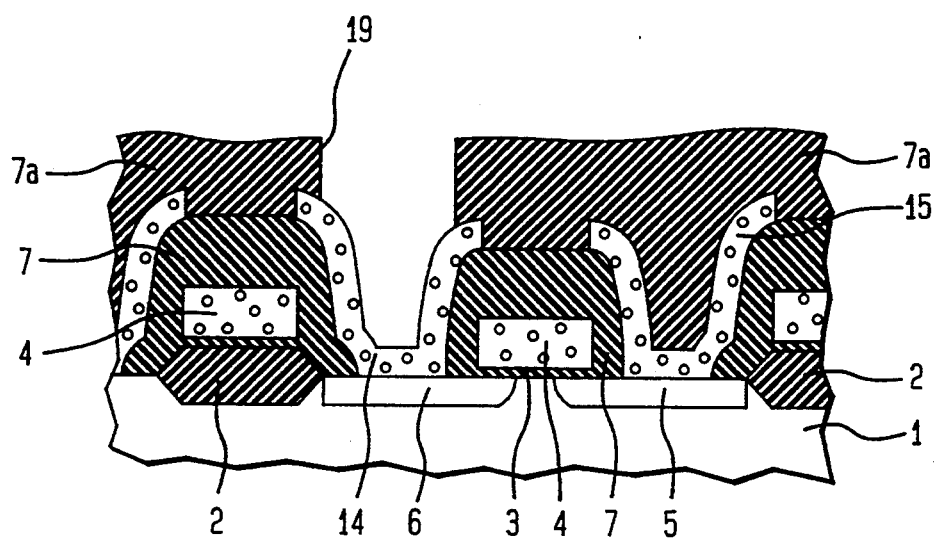
FIGS. 8A through 8D are cross-sectional views showing a sequence of processes in the production method of the third embodiment of the invention.

As shown in FIG. 8A, like in the first embodiment, the element isolation film 2, the transistor comprising the gate oxide film 3, gate electrode 4, and drain 5 and source 6, the interlayer isolation film 7, the lead pad 15 for the bit line (not shown), the polycrystalline silicon lead pad 14 for the storage electrode (not shown), the interlayer film 7a and the contact hole 19 were formed on the semiconductor substrate 1.

Figure 8B:
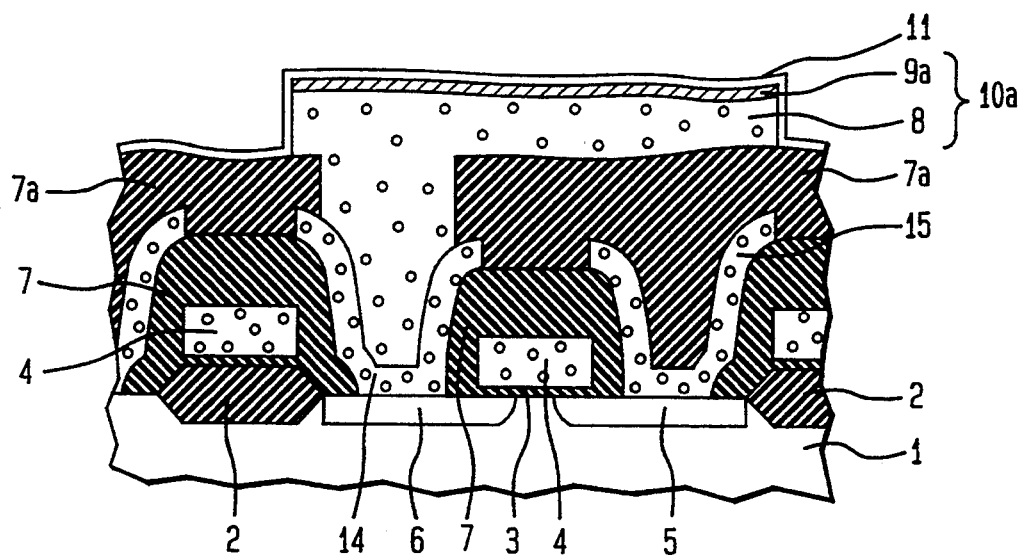

Next, a polycrystalline silicon was deposited over the entire surface including the contact hole 19, and then tungsten was deposited on the polycrystalline silicon, and the storage electrode 10b comprising the patterned polycrystalline silicon layer 8 and the metal layer 9a was formed by lithography and dry etching, as shown in FIG. 8B.

Figure 8C:
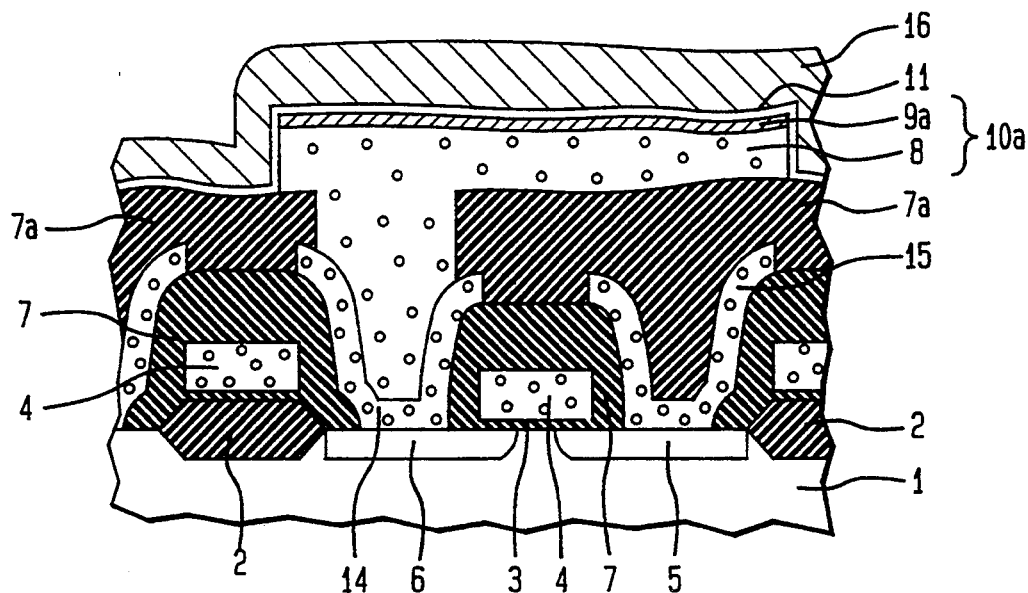

As shown in FIG. 8C, the dielectric layer 11 made from tantalum pentoxide ($Ta_2O_5$) was formed on the storage electrode 10a and the interlayer film 7a by a CVD technique, and then the tungsten silicide layer 16, which becomes the bottom layer of the plate electrode, was formed on the dielectric layer 11.

Figure 8D:
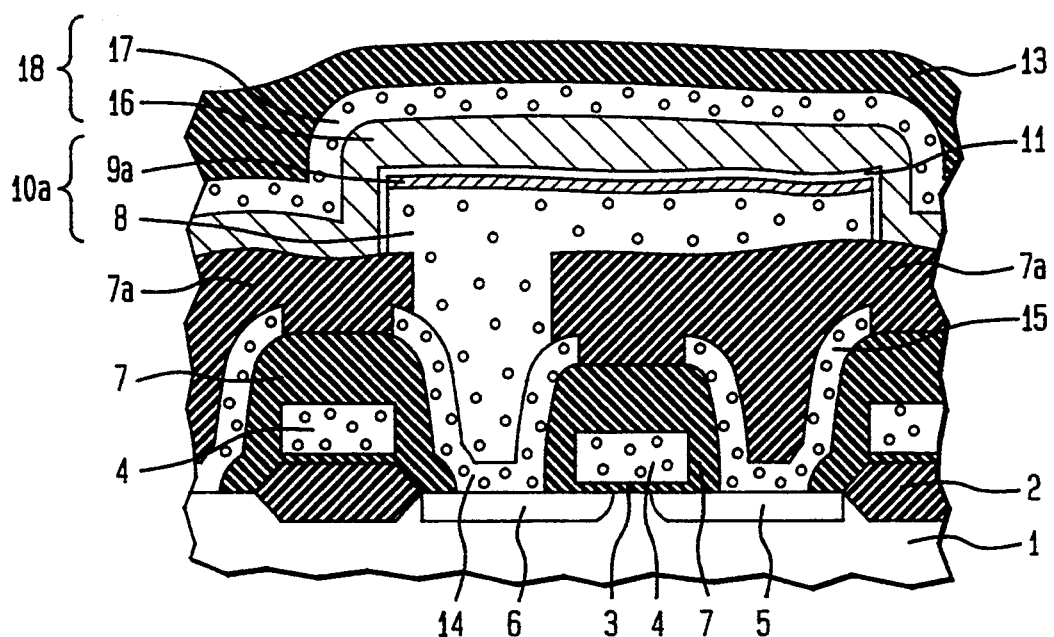

As shown in FIG. 8D, the polycrystalline silicon layer 17, which becomes the top layer of the plate electrode 18, was formed on the tungsten silicide layer 16. Following this, the interlayer isolation film 13, metal wiring (not shown) and passivation film (not shown) were formed on the plate electrode 18.

FIGS. 9a through 9D show a sequence of processes in the production method of the semiconductor device of the fourth embodiment of the invention.

Figure 9A:
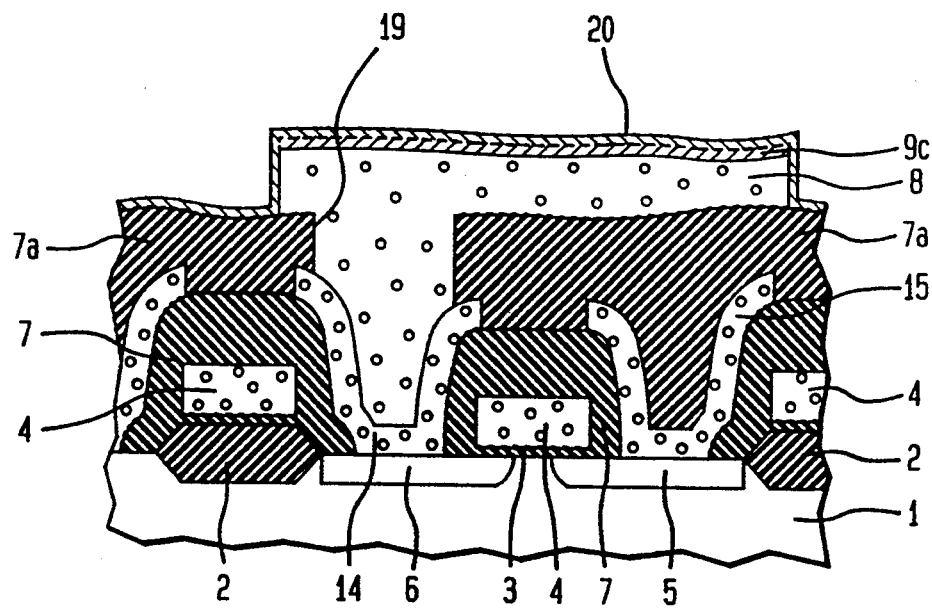
FIGS. 9A through 9D are cross-sectional views showing a sequence of processes in the production method of the forth embodiment of the invention.

As shown in FIG. 9A, like in the first embodiment, the element isolation film 2, the transistor comprising the gate oxide film 3, gate electrode 4, and drain 5 and source 6, the interlayer isolation film 7, the lead pad 15 for the bit line (not shown), the polycrystalline silicon lead pad 14 for the storage electrode (not shown), the interlayer film 7a and the contact hole 19 were formed on the semiconductor substrate 1. Also, polycrystalline silicon was deposited over the entire surface including the contact hole 19, and then tungsten was deposited on the polycrystalline silicon, and after the polycrystalline silicon layer 8 and the tungsten layer 9c were formed by lithography and dry etching, the metal layer 20 was formed by deposition of tungsten over the entire surface by a CVD technique.

Figure 9B:
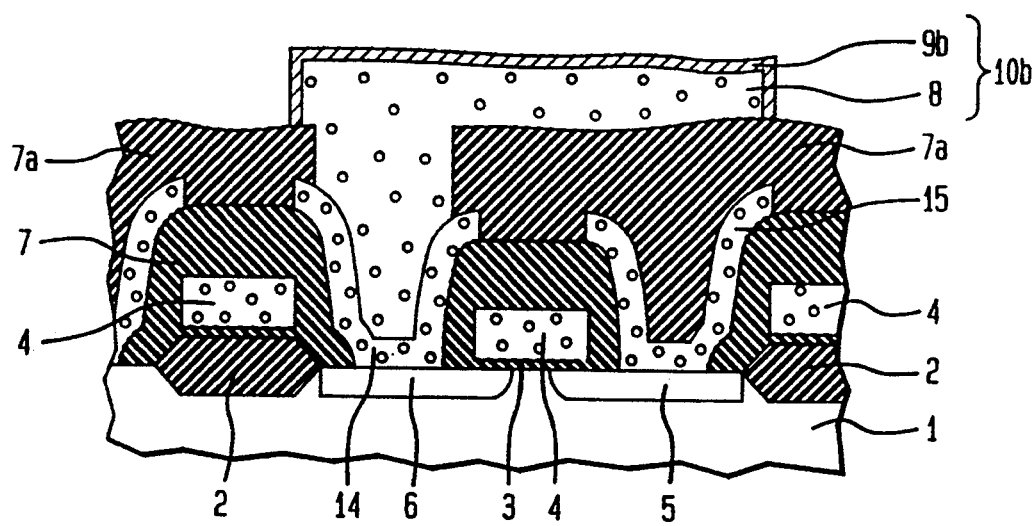

Next as shown in FIG. 9B, the metal layer 20 was etched back from the surface thereof by an etch-back technique using anisotropic etching, thereby leaving the tungsten layer 9b only on the surfaces (top and side surfaces) of the polycrystalline silicon layer 8. Thus, the storage electrode 10b was formed from the polycrystalline silicon layer 8 and the tungsten layer 9b that covers the entire surface of the polycrystalline silicon layer 8.

Figure 9C:
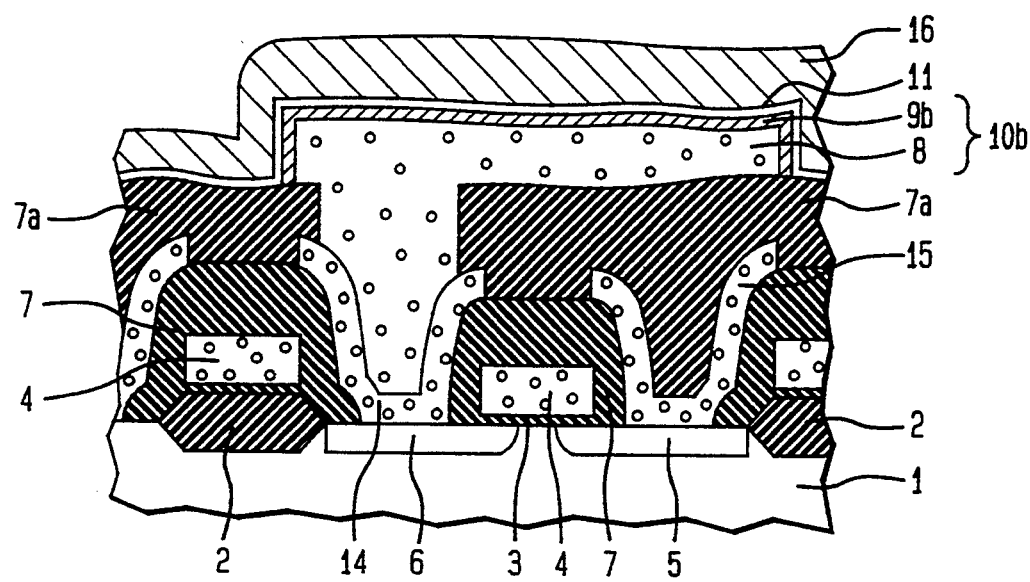

As shown in FIG. 9C, the dielectric layer 11 made of the $Ta_2O_5$ was formed on the tungsten layer 9b of the storage electrode 10b and the interlayer film 7a, and then the tungsten silicide layer 16, which becomes the bottom layer of the plate electrode, was formed on the dielectric layer 11.

Figure 9D:
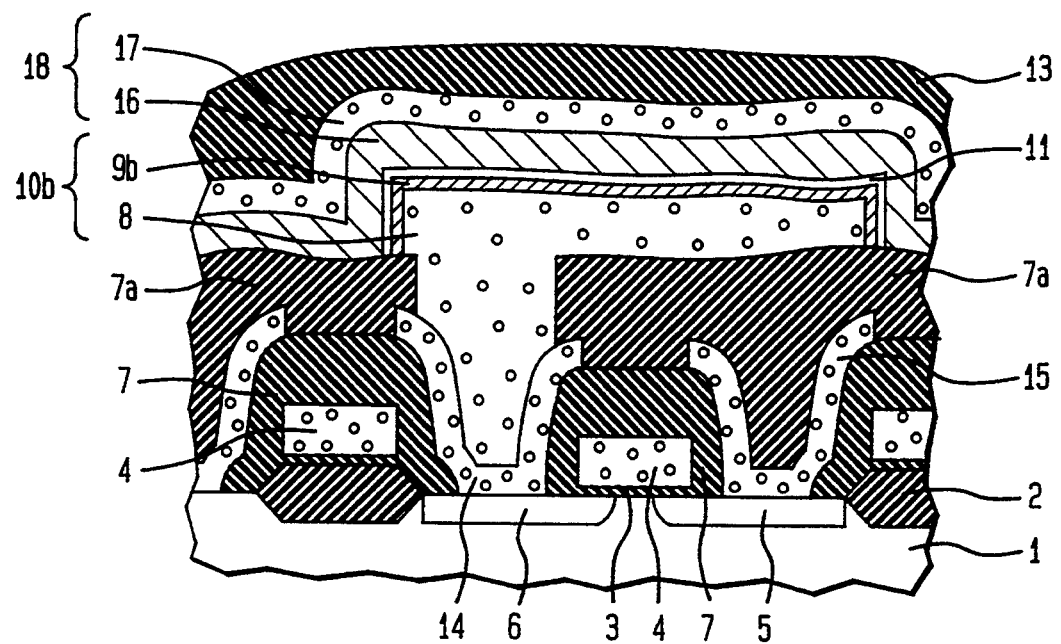

As shown in FIG. 9D, the polycrystalline silicon layer 17, which becomes the top layer of the plate electrode 18, was formed on the tungsten silicide layer 15. Following this, the interlayer isolation film 13, metal wiring (not shown) and passivation film (not shown) were formed on the plate electrode 18.

FIGS. 10A through 10D show a sequence of processes in the production method of the semiconductor device of the fifth embodiment of the invention.

Figure 10A:
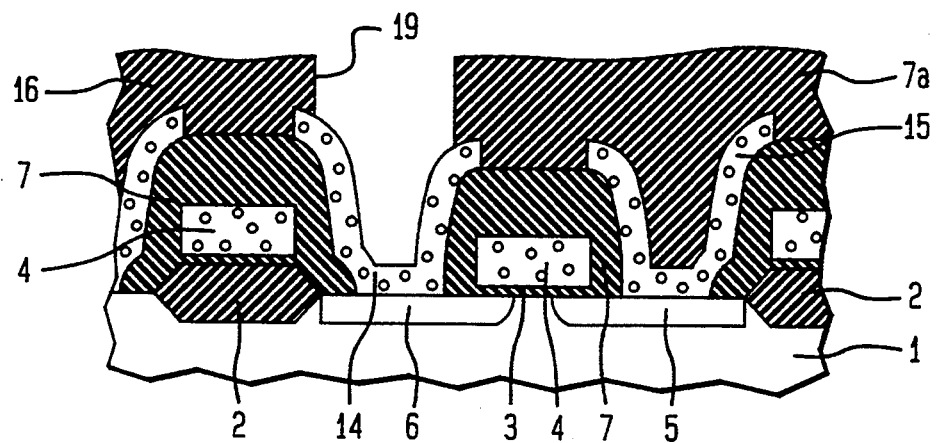
FIGS. 10A through 10D are cross-sectional views showing a sequence of processes in the production method of the fifth embodiment of the invention.

As shown in FIG. 10A, like in the first embodiment, the element isolation film 2, the transistor comprising the gate oxide film 3, gate electrode 4, drain 5 and source 6, the interlayer isolation film 7, the lead pad 15 for the bit line (not shown), the polycrystalline silicon lead pad 14 for the storage electrode (not shown), the interlayer film 7a and the contact hole 19 were formed on the semiconductor substrate 1.

Figure 10B:
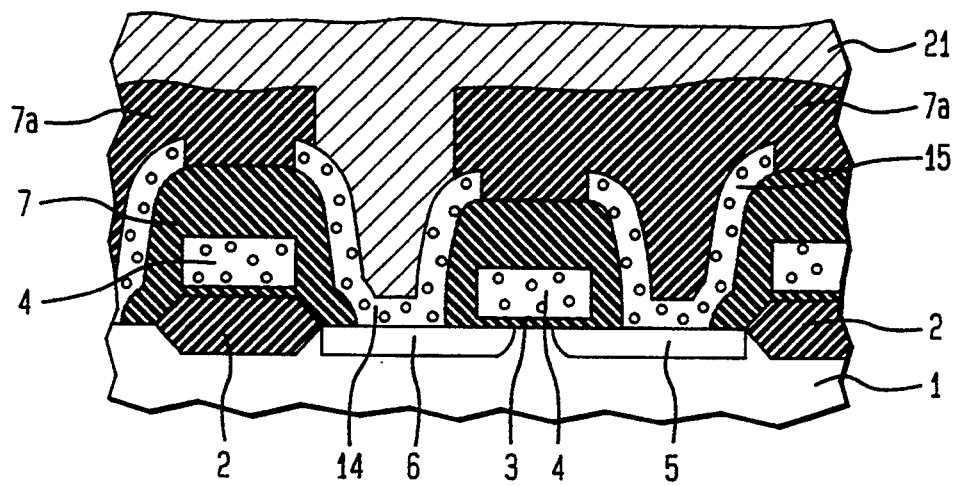
Figure 10C:
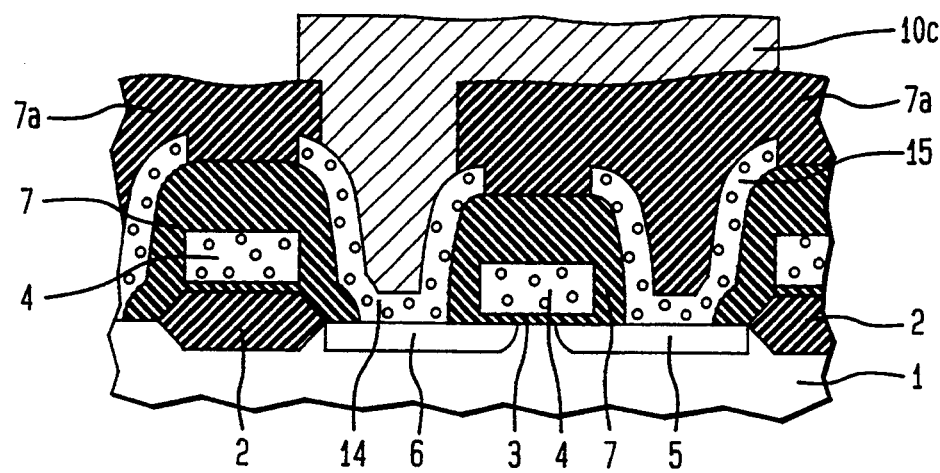

Next, as shown in FIG. 10B, a tungsten film 21 was deposited over the entire surface including the contact hole 19 to a thickness of 200 nm by a blanket CVD technique. Next, as shown in FIG. 10C, the storage electrode 10c was formed by patterning the tungsten film 21 using lithography and dry etching.

Figure 10D:
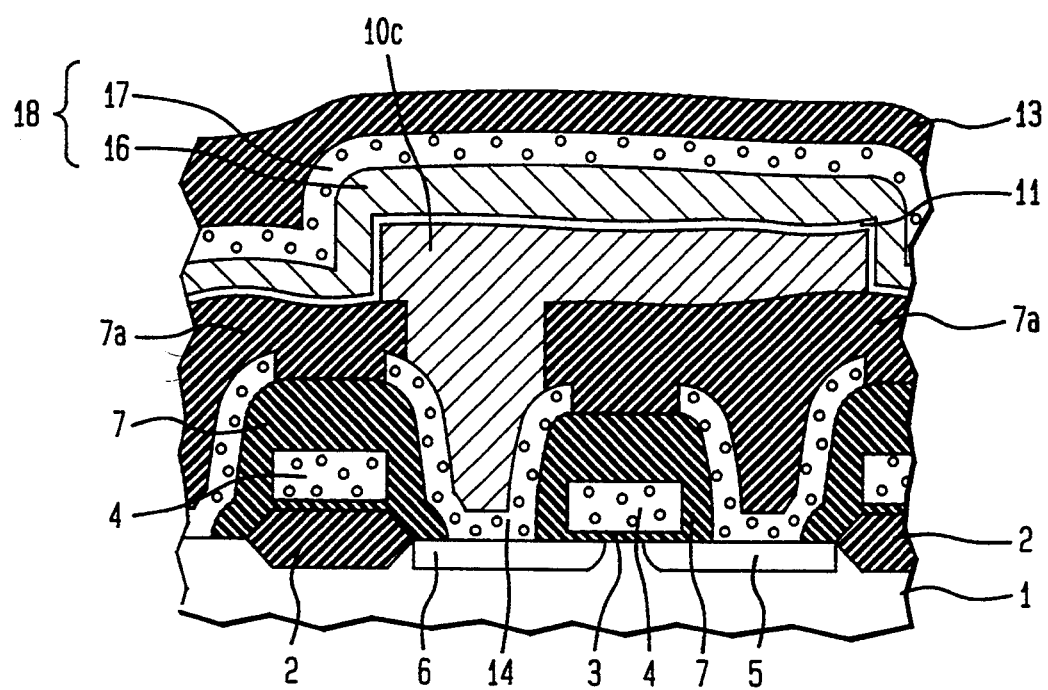
Figure 11:
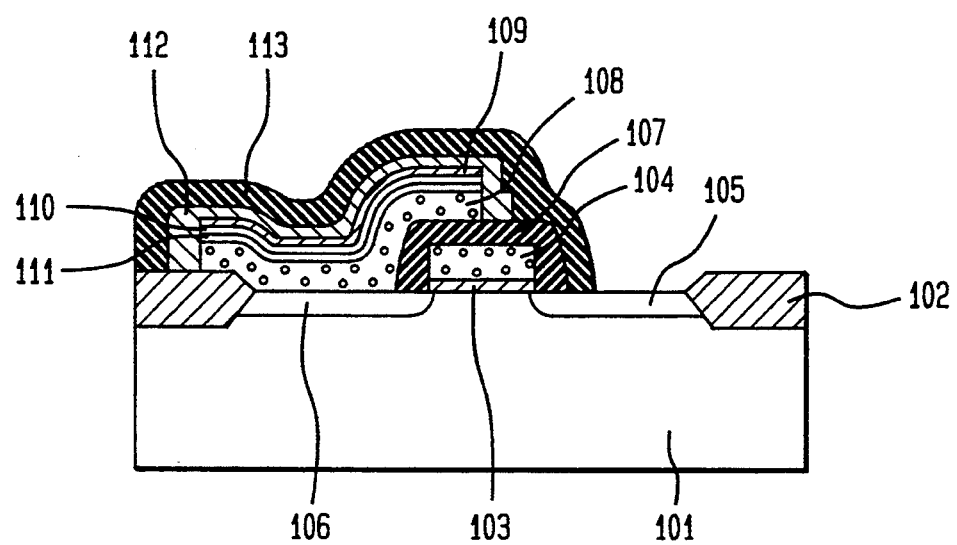
FIG. 11 is a cross-sectional view of a prior art semiconductor memory device.

Also, like in the third and fourth embodiments, the dielectric layer 11, plate electrode 18 comprising the tungsten silicide layer 16 as the bottom layer and the polycrystalline silicon layer 17 as the top layer, the interlayer isolation film 13, metal wiring (not shown) and passivation film (not shown) were formed as shown in FIG. 10D.

The storage electrode 10b in the production method of the second embodiment can also be formed by the same method shown in FIGS. 9A and 9B. Further, the storage electrode 10b in the production method of the fourth embodiment can also be formed by the same method shown in FIGS. 7A and 7B.

According to the embodiments, a metal layer or metal silicide layer is disposed between the polycrystalline silicon layer constituting the storage electrode and the dielectric layer made from tantalum pentoxide, and the metal constituting this metal layer or metal silicide layer has a larger free energy of oxide formation than the free energy of oxide formation of the tantalum constituting the dielectric layer. Therefore, no native oxide film or metal oxide film is formed at the interface between the storage electrode and the dielectric layer made of tantalum pentoxide. As a result, the dielectric constant of the capacitor comprising the storage electrode, the dielectric layer and the plate electrode does not decrease even if the dielectric layer made of tantalum pentoxide is formed as a thin film, thus providing significant practical effectiveness by making possible a planar type capacitor.

It is understood that various other modifications will be apparent to and can be readily made by those skilled in the art without departing from the scope and spirit of This invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory device comprising a plurality of memory cells each having a switching transistor and a storage capacitor, said storage capacitor comprising:
   a first electrode electrically connected to said switching transistor, said first electrode having a top face and a side face;
   a protection layer formed on said first electrode;
   a dielectric layer formed on said protection layer, said dielectric layer being made of a first metal oxide; and
   a second electrode formed on said dielectric layer;
   wherein said protection layer consists of a refractory metal with a lower tendency to oxidize as compared to the oxide-forming tendency of the metal of said first metal oxide, and said protection layer covers said top face and said side face of said first electrode.

2. A semiconductor memory device comprising a plurality of memory cells each having a switching transistor and a storage capacitor, said storage capacitor comprising:
   a first electrode electrically connected to said switching transistor;
   a dielectric layer formed on said first electrode, said dielectric layer being made of a first metal oxide; and
   a second electrode formed on said dielectric layer wherein said second electrode includes at least a first layer formed on said dielectric layer and a second layer formed on said first layer, said first layer being made of a material which has a lower tendency to oxidize as compared to the oxide-forming tendency of the metal of said first metal oxide, said second layer covering entirely a top face of said first layer;
   wherein said first electrode comprises a conductive material with a lower tendency to oxidize as compared to the oxide-forming tendency of the metal of said first metal oxide.

3. A semiconductor memory device according to claim 1 or 2, wherein said second electrode is made of a material which has a lower tendency to oxidize to form a third oxide as compared to the oxide-forming tendency of the metal of said first metal oxide.

4. A semiconductor memory device according to claim 1, wherein said second electrode includes at least a first layer formed on said dielectric layer and a second layer formed on said first layer, said first layer being made of a material which has a lower tendency to oxidize as compared to the oxide-forming tendency of the metal of said first metal oxide.

5. A semiconductor memory device according to claim 1, wherein said first oxide is tantalum oxide, and said refractory metal is selected from the group consisting of tungsten and molybdenum.

6. A semiconductor memory device according to claim 2, wherein said first oxide is tantalum oxide, and said conductive material is a material selected from the group consisting of tungsten, molybdenum, tungsten silicide, and molybdenum silicide.

7. A semiconductor memory device according to claim 5 or 6, wherein said second electrode is made of a material selected from the group consisting of tungsten, molybdenum, tungsten silicide, and molybdenum silicide.

8. A semiconductor memory device according to claim 5 or 6; wherein said second electrode includes at least a first layer formed on said dielectric layer and a second layer formed on said first layer, said first layer being made of a material selected from the group consisting of tungsten, molybdenum, tungsten silicide, and molybdenum silicide.

9. A semiconductor memory device according to claim 2, wherein said second layer of said second electrode is made of polycrystalline silicon.

* * * * *